(12) United States Patent
Bae et al.

(10) Patent No.: US 7,456,673 B2
(45) Date of Patent: Nov. 25, 2008

(54) MULTI-PHASE CLOCK GENERATOR

(75) Inventors: Seung Jun Bae, Kyungbuk (KR); Hong June Park, Kyungbuk (KR)

(73) Assignees: Postech Foundation (KR); Postech Academy-Industry Foundation (KR)

( * ) Notice: Subject to any disclaimer, the term of this patent is extended or adjusted under 35 U.S.C. 154(b) by 0 days.

(21) Appl. No.: 11/625,541

(22) Filed: Jan. 22, 2007

(65) Prior Publication Data

US 2007/0170967 A1    Jul. 26, 2007

(30) Foreign Application Priority Data

Jan. 23, 2006   (KR) .................... 10-2006-0006874

(51) Int. Cl.
*H03K 3/00* (2006.01)

(52) U.S. Cl. ............... 327/291; 327/295; 327/155; 327/161

(58) Field of Classification Search ......... 327/291–293, 327/295–297, 155, 158–161, 2, 3, 5, 12
See application file for complete search history.

(56) References Cited

U.S. PATENT DOCUMENTS

| | | | |
|---|---|---|---|
| 6,683,928 B2 * | 1/2004 | Bhullar et al. | 375/374 |
| 6,812,760 B1 * | 11/2004 | Kim et al. | 327/158 |
| 2004/0155686 A1 * | 8/2004 | Kim et al. | 327/158 |

* cited by examiner

*Primary Examiner*—An T Luu
(74) *Attorney, Agent, or Firm*—Cantor Colburn LLP

(57) ABSTRACT

Provided is a multi-phase clock generator which is not influenced by a mismatch and of which a maximum frequency is not limited. The multi-phase clock generator includes a first delay line, a second delay line, a phase detector, and an up/down counter. The first delay line generates a first clock signal by delaying an input clock for a first delay time. The second delay line generates a second clock signal by delaying the input clock for a second delay time in response to a control signal. The phase detector detects a phase difference between the first and second clock signals. The up/down counter generates the control signal in response to an output of the phase detector.

7 Claims, 5 Drawing Sheets

MULTI-PHASE CLOCK GENERATOR

BACKGROUND OF THE INVENTION

1. Field of the Invention

The present invention relates to a multi-phase clock generator, and more particularly, to a multi-phase clock generator which can be controlled by a digital signal.

2. Description of the Related Art

In order to increase an operation speed of an inside of a chip or a communication speed between chips as compared with a frequency of a clock signal that is externally input, a clock having a multi-phase is used. For example a method of increasing a transmission speed by using a number of clocks having a low frequency and serializing data generated from a rising edge of each clock signal is used. When a multi-clock is used, although an operation speed of the inside of the chip is currently 3 GHz, the communication speed between chips of 10 Gb/s or more can be achieved. In order to generate the multi-clock, a phase locked loop (PLL) and a delay locked loop (DLL) are generally used.

A core circuit block for generating clocks having a multi-phase by using the PLL and the DLL is a delay line block.

FIG. 1 is a block diagram for explaining a general DLL.

Referring to FIG. 1, the DLL 100 includes a delay line 110, a phase detector 120, and a charge pump/loop filter 130.

The delay line 110 includes four delay cells for generating four clocks clk90, clk180, clk270, and clk360 having a time interval of 0.25T. Here, T is a period of a clock. The phase detector 120 compares a phase of a clock clk0 with a phase of the clock clk360 and outputs a comparing signal Diff in order to synchronize the phases of the clocks clk0 and clk360. The charge pump 130 changes a control voltage Vcon in response to the comparing signal Diff. A delay time of the delay line 110 is controlled by the changed control voltage Vcon so that the phases of the clocks clk0 and clk360 are synchronized.

FIG. 2 is an operation timing diagram of the DLL in FIG. 1.

Referring to FIG. 2, it is shown that when the DLL 100 is locked, rising edges of the clocks clk0 and clk360 are synchronized, so that the output clocks clk90, clk180, clk270, and clk 360 of the DLL 100 have an interval of 0.25T.

The DLL 100 for generating clocks having a multi-phase has the following problems.

First, time intervals between the clocks clk90, clk180, clk270, and clk360 may change due to mismatches between delay cells disposed inside the delay line 110 or mismatches in paths along which the clocks clk90, clk180, clk270, and clk360 pass. The mismatches between the delay cells mainly occur due to a difference in a size or in a threshold voltage between transistors. In particular, when the operation speed of the clock is increased, a delay time of the delay cell has to be lowered. However, a channel length L of the transistor can be shortened, so that the mismatches may become larger.

Second, minimum time intervals between the clocks clk90, clk180, clk270, and clk360 are restricted by a minimum delay time of the delay cell. More specifically, a clock having a smaller time interval than a delay time of a delay cell cannot be generated.

Accordingly, an increase in the operation speed of the DLL 100 is limited.

SUMMARY OF THE INVENTION

The present invention provides a multi-phase clock generator which is not influenced by a mismatch and of which a maximum frequency is not limited.

According to an aspect of the present invention, there is provided a multi-phase clock generator including a first delay line, a second delay line, a phase detector, and an up/down counter. The first delay line generates a first clock signal Clock_0 by delaying an input clock Clock_in for a first delay time. The second delay line generates a second clock signal Clock_90 by delaying the input clock for a second delay time in response to a control signal Ctrl. The phase detector detects a phase difference between the first and second clock signals Clock_0 and Clock_90. The up/down counter 380 generates the control signal Ctrl in response to an output of the phase detector.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
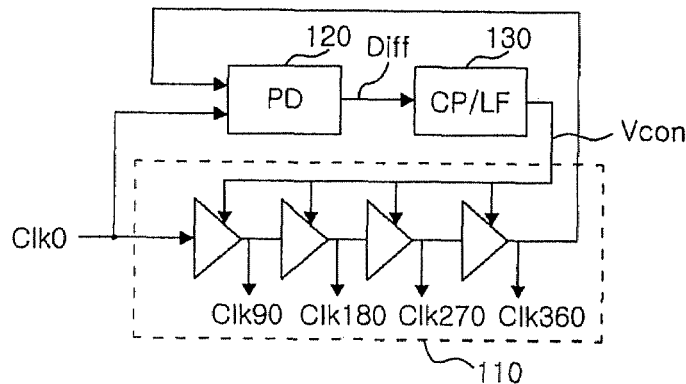
FIG. 1 is a block diagram for explaining a general delay locked loop (DLL)
Figure 2:
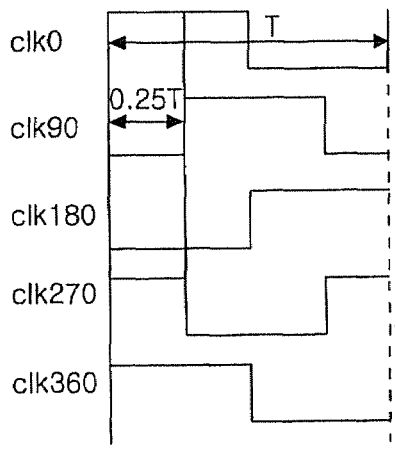
FIG. 2 is an operation timing diagram of the DLL in FIG. 1.

The attached drawings for illustrating exemplary embodiments of the present invention are referred to in order to gain a sufficient understanding of the present invention, the merits thereof, and the objectives accomplished by the implementation of the present invention.

Hereinafter, exemplary embodiments of the present invention will be described in detail with reference to the attached drawings. Like reference numerals in the drawings denote like elements.

Figure 3:
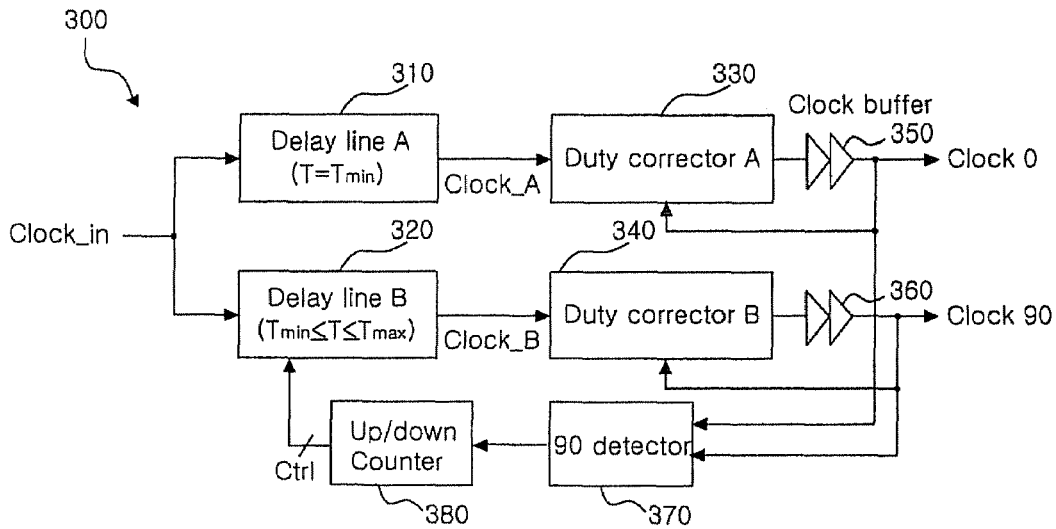
FIG. 3 is a block diagram showing a multi-phase clock generator according to an embodiment of the present invention.

FIG. 3 is a block diagram showing a multi-phase clock generator according to an embodiment of the present invention.

Referring to FIG. 3, the multi-phase clock generator 300 includes a first delay line block 310, a second delay line block 320, a first duty corrector block 330, a second duty corrector block 340, a first clock buffer block 350, a second clock buffer block 360, a phase detector 370, and an up/down counter 380.

The first delay line block 310 generates a first clock signal Clock_A by delaying an input clock Clock_in and includes delay cells performing the aforementioned processes and having a fixed delay time T=Tmin.

The second delay line block 320 generates a second block signal Clock_B by delaying the input block Clock_in in response to a control signal Ctrl and includes delay cells having a delay time Tmin≦T≦Tmax that varies in response to the control signal Ctrl including digital bits provided by the up/down counter 380.

The first duty corrector block 330 corrects a duty of the first clock signal Clock_A so that a ratio of a logic high section to a logic low section of the clock signal is 1:1 (50%). The first clock signal Clock_A having the corrected duty is output through the first clock buffer block 350, and the output signal is assumed to be a third clock signal Clock_0.

The second duty corrector block 340 corrects a duty of the second clock signal Clock_B so that the duty is 50%. The second clock signal Clock_B having the corrected duty is output through the second clock buffer block 360, and the output signal is assumed to be a fourth clock signal Clock_90.

Here, the third and fourth clock signals Clock_0 and Clock_90 may have a phase difference of 90°, and for the phase difference, the phase detector 370 exists.

The phase detector 370 detects the phase difference between the third and fourth clock signals Clock_0 and Clock_90. When the phase difference between the third and fourth clock signals Clock_0 and Clock_90 is less than 90°, the up/down counter 380 is controlled so that a delay time of the second delay line block 320 is increased. When the phase difference between the third and fourth clock signals Clock_0 and Clock_90 is more than 90°, the up/down counter 380 is controlled so that the delay time of the second delay line block 320 is decreased.

The multi-phase clock generator 300 can theoretically increase a delay time difference between the first and second clock signals Clock_A and Clock_B to infinity. Therefore, unlike an operation speed of a multi-phase clock generator using an existing DLL and PLL, which is limited by a minimum delay time of a delay cell, an operation speed of the multi-phase clock generator according to the present invention is not limited.

Since the third and fourth clock signals Clock_0 and Clock_90 have the corrected duties, detecting the phase difference between the third and fourth clock signals Clock_0 and Clock_90 is not influenced by a mismatch of the delay cells for generating the basic signals Clock_A and Clock_B of the third and fourth clock signals Clock_0 and Clock_90 or a mismatch of a clock path.

Figure 4:
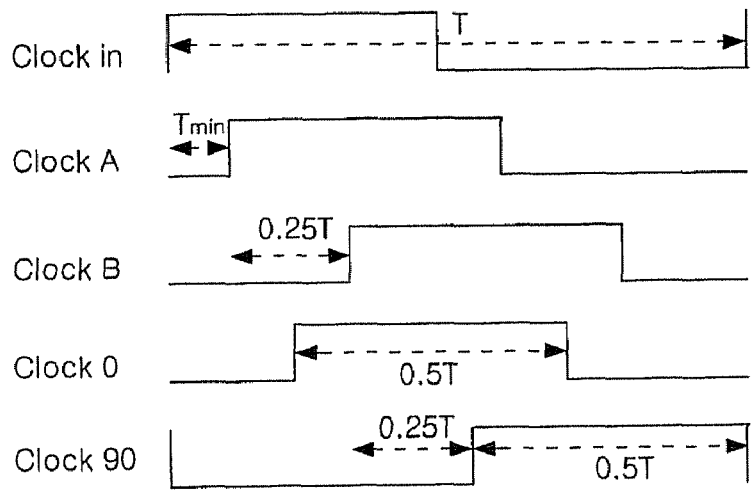
FIG. 4 is an operation timing diagram of the multi-phase clock generator shown in FIG. 3.

FIG. 4 is an operation timing diagram of the multi-phase clock generator shown in FIG. 3.

Referring to FIG. 4, when it is assumed that the input clock Clock_in has a period of T, the first clock signal Clock_A has the minimum fixed delay time Tmin. The delay time of the second clock signal Clock_B is changed according to the control signal Ctrl. A minimum delay time of the second clock signal Clock_B is the same as that of the first clock signal Clock_A. Operations of the multi-phase clock generator 300 is terminated, a phase difference between the first and second clock signals Clock_A and Clock_B becomes 90°, that is, 0.25T in terms of a time. The phase difference between the third and fourth clock signals Clock_0 and Clock_90 that are generated by correcting the duties of the first and second clock signals Clock_A and Clock_B to be 50% and buffering them also becomes 90°.

Figure 5:
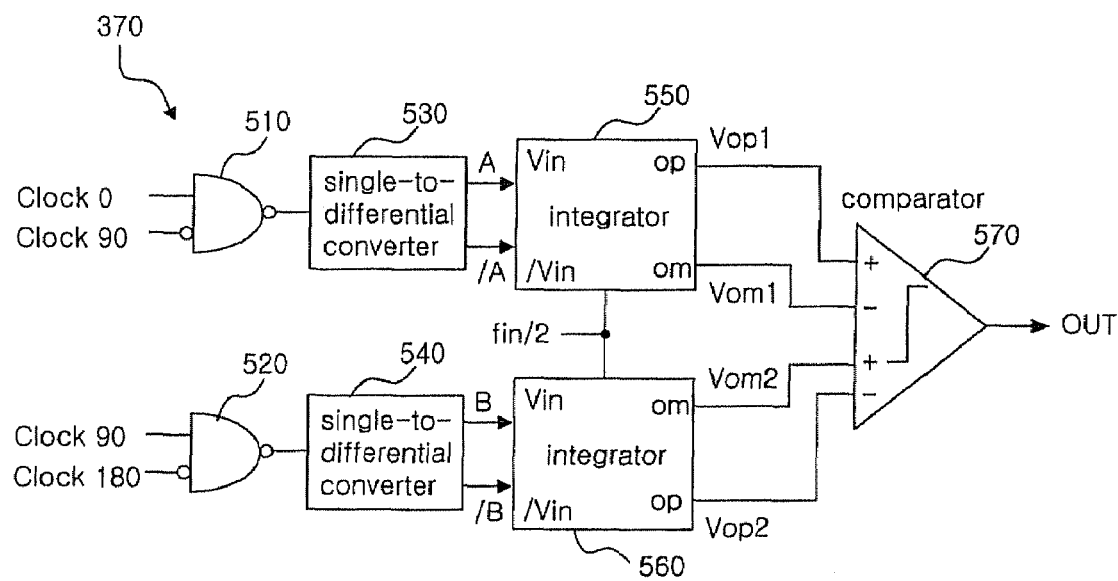
FIG. 5 is a block diagram showing a phase detector shown in FIG. 3.

FIG. 5 is a block diagram showing the phase detecting unit shown in FIG. 3.

Referring to FIG. 5, the phase detector 370 includes a first NAND gate 510, a second NAND gate 520, a first single-to-differential converter 530, a second single-to-differential converter 540, a first integrator 550, a second integrator 560, and a comparator 570.

The first NAND gate 510 receives the third clock signal Clock_0 and the phase converted fourth clock signal Clock_90. The second NAND gate 520 receives the fourth clock signal Clock_90 and a phase converted fifth clock signal Clock_180. The fifth clock signal Clock_180 is a signal obtained by converting a phase of the third clock signal Clock_0.

The third and fourth clock signals Clock_0 and Clock_90 are set to have a phase difference of 90°, and the fourth and fifth clock signals Clock_90 and Clock_180 are also set to have a phase difference of 90°.

The first single-to-differential converter 530 converts an output of the first NAND gate 510 into two first differential signals A and /A. The first differential signal A is transited to a logic high in a section between rising edges of the third and fourth clock signals Clock_0 and Clock_90. The difference between the first differential signals A and /A is phase and the phase difference between the two signals A and /A is 180°.

The second single-to-differential converter 540 converts an output of the second NAND gate 520 into two second differential signals B and /B. The second differential signal B is transited to a logic high in a section between rising edges of the fourth and fifth clock signals clock_90 and clock_180. The difference between the second differential signals B and /B is phase and the phase difference between the two signals B and /B is 180°.

The first integrator 550 performs an integration on the two first differential signals A and /A in response to a control clock fin/2. The second integrator 560 performs an integration on the two second differential signals B and /B in response to the control clock fin/2. Here, the control clock fin/2 is a clock signal having a period that is two times larger than a period of the differential signals.

The comparator 570 generates an output signal OUT comparing outputs of the first and second integrators 550 and 560. The output signal OUT is transmitted to the up/down counter 380 (see FIG. 3) in order to be used to generate the control signal Ctrl.

When the delay time difference between the third and fourth clock signals Clock_0 and Clock_90 detected by the phase detector 370 is 0.25T, that is, 90°, lengths of the logic high sections of the first and second differential signals A and B become the same. Therefore, the output values of the first and second integrators 560 and 570 become the same. In this case, an output of the comparator 570 becomes a logic high or a logic low so as to be a lock state, the output signal OUT continuously repeats a logic high level and a logic low level.

When the time difference between the third and fourth clock signals Clock_0 and Clock_90 is not 0.25T, the output values of the first and second integrators 530 and 560 become different. In this case, the output signal OUT of the comparator 570 is changed to have a predetermined value so that the time difference between the third and fourth clock signals Clock_0 and clock_90 is 0.25T.

Figure 6:
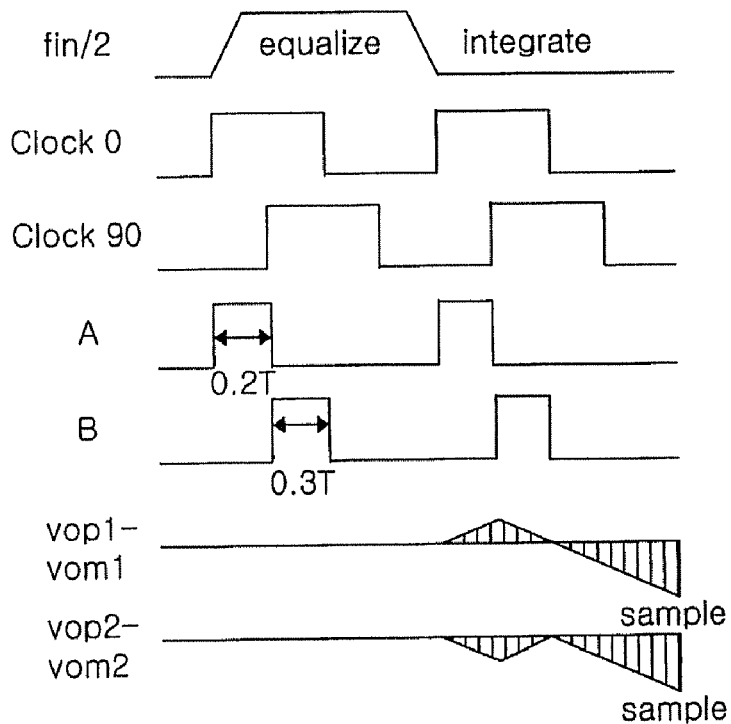
FIG. 6 shows an output of a phase detector 370 when a delay time difference between a third clock signal Clock_0 and a fourth clock signal Clock_90 is 0.2T.

FIG. 6 shows an output of the phase detector 370 when the delay time difference between the third clock signal Clock_0 and the fourth clock signal Clock_90 is 0.2T.

Referring to FIG. 6, a time interval of 0.3T of a login high section of the second differential signal B is longer than a time interval of 0.2T of a logic high section of the first differential signal A, so that the output values of the two integrators 550 and 560 become different.

Figure 7:
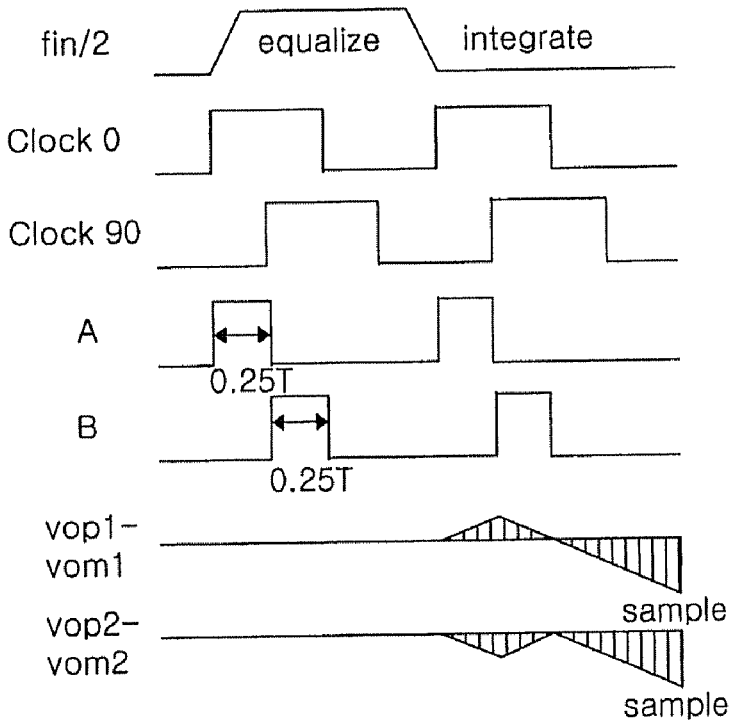
FIG. 7 shows an output of a phase detector 370 when a delay time difference between a third clock signal Clock_0 and a fourth clock signal Clock_90 is 0.25T.

FIG. 7 shows an output of the phase detector 370 when the delay time difference between the third clock signal Clock_0 and the fourth clock signal Clock_90 is 0.25T.

Referring to FIG. 7, the time interval of 0.25T of the logic high section of the first differential signal A is the same as the time interval of 0.25T of the logic high section of the second differential signal B, so that the outputs of the two integrators become the same.

Figure 8:
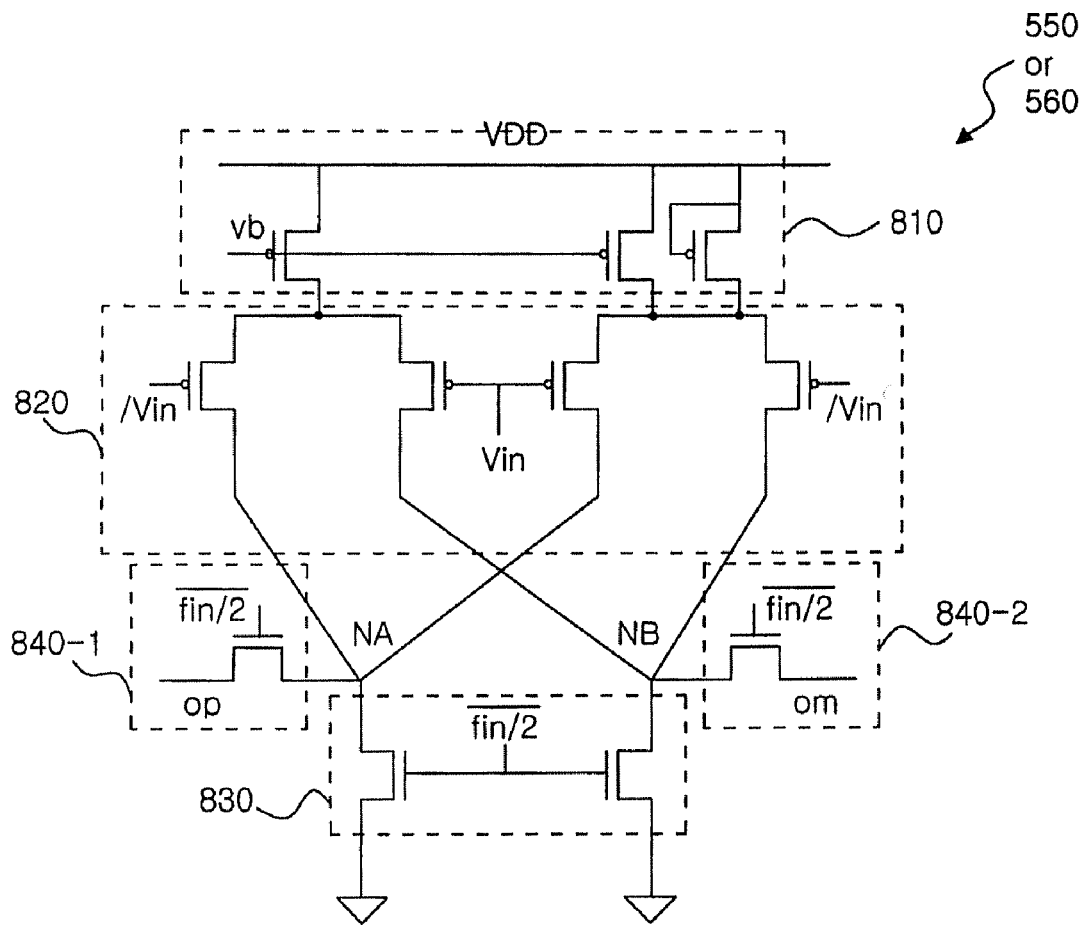
FIG. 8 is a circuit diagram of an integrator shown in FIG. 5.

FIG. 8 is a circuit diagram of the integrator shown in FIG. 5.

Referring to FIG. 8, representatively, the first integrator 550 includes a power source supply 810, a first transmitter 820, a discharge unit 830, and a second transmitter 840-1, 840-2.

The power source supply 810 supplies a power source voltage VDD to the first integrator 550 in response to a bias signal Vb. The first transmitter 820 is connected to the power source supply 810 and transmits the power source voltage VDD supplied from the power source supply 810 to a first node NA and a second node NB in response to the first differential signal A and the complementary first differential signal /A. The discharge unit 830 discharges voltage levels of the first and second nodes NA and NB to a ground voltage VSS in response to the control clock fin/2. The second transmitter 840-1, 840-2 transmit the voltage levels of the first and second nodes NA and NB to the comparator 570 (see FIG. 5) in response to an inverted control clock $\overline{\text{fin}/2}$ obtained by inverting a phase of the control clock fin/2.

Figure 9:
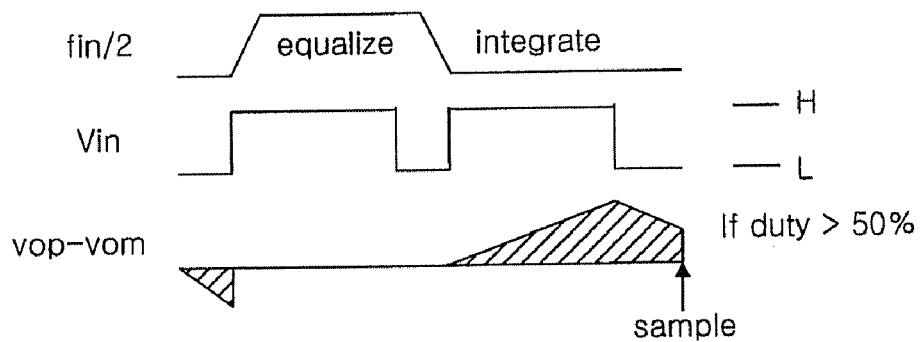
FIG. 9 is an operation time diagram of the integrator shown in FIG. 8.

FIG. 9 is an operation time diagram of the integrator shown in FIG. 8.

Referring to FIG. 9, the control clock fin/2 is a signal having a period that is two times a period of an input clock Vin and is used to allow the outputs of the integrators to be the ground voltage VSS in a logic high section and used to operate the integrators 550 and 560 in a logic low section. When the logic low section of the control clock fin/2 is ended, the outputs of the integrators 550 and 560 become the input of the comparator 570 (see FIG. 5)

Figure 10:
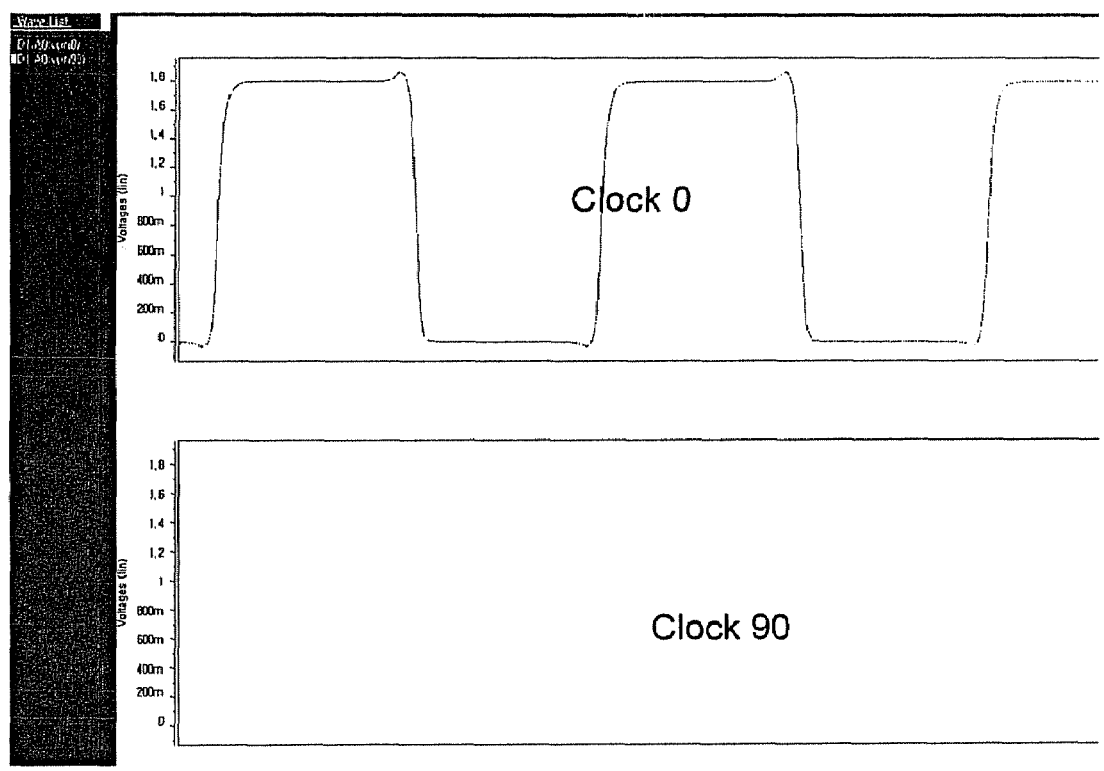
FIG. 10 is a result of a computer simulation of the multi-phase clock generator shown in FIG. 3.

FIG. 10 is a result of a computer simulation of the multi-phase clock generator shown in FIG. 3.

Referring to FIG. 10, the computer simulation is performed assuming that a frequency of an input clock is 1 GHz. When operations of the multi-phase clock generator 300 is terminated, a term during a half period of the clock is 507 ps (pico seconds), and a difference of the third and fourth clock signals Clock_0 and Clock_90 is 253 ps that has an error of 3 ps as compared with a desired design value.

The multi-phase clock generator according to the present invention generates clocks having a 90° phase difference by using integrators. In a related method using a conventional delay locked loop (DLL) and phase locked loop (PLL), clock skew occurs due to a mismatch between transistors and a mismatch between clock paths, and a maximum operation frequency is limited due to a minimum delay time of delay cells. On the contrary, the multi-phase clock generator according to the present invention generates the 90° phase difference by using a relative difference between a first and second delay lines, so that a maximum frequency is not limited.

The multi-phase clock generator according to the present invention detects a phase difference between final output clocks, that is, third and fourth clock signals, so that the multi-phase clock generator is not influenced by mismatches. Therefore, clocks having a precise 90° phase difference with a high frequency can be generated.

Since the multi-phase clock generator according to the present invention is implemented in a digital manner, the multi-phase clock generate can remember lock information even in a low power mode.

The multi-phase clock generator according to the present invention can be used in a digital circuit with a high frequency and an interface circuit between chips.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A multi-phase clock generator comprising:
   a first delay line generating a first clock signal by delaying an input clock for a first delay time;
   a second delay line generating a second clock signal by delaying the input clock for a second delay time in response to a control signal;
   a phase detector detecting a phase difference between the first and second clock signals; and
   an up/down counter generating the control signal in response to an output of the phase detector,
   wherein the phase detector comprises:
   a first NAND gate receiving the first clock signal and an inverted second clock signal;
   a second NAND gate receiving the second clock signal and a third clock signal;
   a first single-to-differential converter converting an output of the first NAND gate into first differential signals A and /A;
   a second single-to-differential converter converting an output of the second NAND gate into second differential signals B and /B;
   a first integrator performing an integration on the first differential signals in response to a control clock having a period that is two times a period of the differential signals;
   a second integrator performing an integration on the second differential signals in response to the control clock; and
   a comparator comparing outputs of the first and the second integrators,
   wherein the third clock signal is a signal obtained by converting a phase of the first clock signal, and
   wherein the control clock has a period that is two times the period of the differential signals.

2. The multi-phase clock generator of claim 1, wherein the first delay time is a fixed value and the second delay time varies according to the control signal.

3. The multi-phase clock generator of claim 1,
   wherein the first delay line comprises a first delay line block for outputting the first clock signal by delaying the input clock for the first delay time; and
   wherein the second delay line comprises a second delay line block for outputting the second clock signal by delaying the input clock for the second delay time in response to the control signal.

4. The multi-phase clock generator of claim 3,
   wherein the first delay line further comprises a first duty corrector block for correcting a duty of the first clock signal; and
   wherein the second delay line further comprises a second duty corrector block for correcting a duty of the second clock signal.

5. The multi-phase clock generator of claim 4,
   wherein the first delay line further comprises a first clock buffer clock for buffering the first clock signal; and
   wherein the second delay line further comprises a second clock buffer block for buffering the second clock signal.

6. The multi-phase clock generator of claim 1, wherein each of the first and second integrators comprises:

a power source supply supplying a power source voltage in response to a bias signal;

a first transmitter which is connected to the power source supply and transmits the power source voltage supplied from the power source supply to first and second nodes NA and NB in response to a differential signal Vin and a complementary differential signal /Vin;

a discharge unit discharging voltage levels of the first and second nodes to a ground voltage in response to the control clock; and a second transmitter transmitting the voltage levels of the first and second nodes to the comparator in response to an inverted control clock that is obtained by inverting a phase of the control clock.

7. The multi-phase clock generator of claim 1, wherein the phase difference between the first and second clock signals is 90°.

* * * * *